(12) United States Patent
Wu

(10) Patent No.: US 9,099,335 B2
(45) Date of Patent: Aug. 4, 2015

(54) ANALOG CIRCUIT WITH IMPROVED LAYOUT FOR MISMATCH OPTIMIZATION

(71) Applicant: Marvell World Trade Ltd., St. Michael (BB)

(72) Inventor: Albert Wu, Palo Alto, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

(21) Appl. No.: 14/337,539

(22) Filed: Jul. 22, 2014

(65) Prior Publication Data

US 2015/0028422 A1 Jan. 29, 2015

Related U.S. Application Data

(60) Provisional application No. 61/857,943, filed on Jul. 24, 2013.

(51) Int. Cl.
| | | |
|---|---|---|
| *H01L 27/088* | (2006.01) | |
| *H01L 21/77* | (2006.01) | |
| *H01L 21/8234* | (2006.01) | |
| *H01L 27/02* | (2006.01) | |

(52) U.S. Cl.
CPC .............. *H01L 27/088* (2013.01); *H01L 21/77* (2013.01); *H01L 21/823425* (2013.01); *H01L 27/0207* (2013.01); *H01L 21/823412* (2013.01)

(58) Field of Classification Search
CPC .................. H01L 27/088; H01L 21/77; H01L 21/823425

USPC .......................................................... 257/401
See application file for complete search history.

(56) References Cited

U.S. PATENT DOCUMENTS

| | | | | |
|---|---|---|---|---|
| 5,849,614 | A  * | 12/1998 | Chan ............................. | 438/230 |
| 6,927,458 | B2 * | 8/2005  | Worley ......................... | 257/361 |
| 7,405,110 | B2 * | 7/2008  | Nguyen ........................ | 438/142 |
| 7,605,409 | B2 * | 10/2009 | Ahn et al. .................... | 257/211 |
| 7,871,879 | B2 * | 1/2011  | Ko ................................ | 438/211 |
| 2004/0256692 | A1 * | 12/2004 | Kunz et al. ................... | 257/500 |
| 2008/0116527 | A1 | 5/2008 | Hook et al. | |
| 2009/0140342 | A1 * | 6/2009 | Chakihara et al. ............ | 257/365 |

FOREIGN PATENT DOCUMENTS

| | | |
|---|---|---|
| JP | 2005086120 A | 3/2005 |
| JP | 2011243843 A | 12/2011 |

OTHER PUBLICATIONS

PCT Search Report and Written Opinion mailed Oct. 15, 2014 for PCT Application No. PCT/US14/47883, 9 Pages.

* cited by examiner

*Primary Examiner* — Allan R Wilson

(57) ABSTRACT

Embodiments include a semiconductor device comprising: a substrate; a first transistor formed on the substrate; and a second transistor formed on the substrate, wherein a common region of the semiconductor device forms (i) a drain region of the first transistor, and (ii) a source region of the second transistor, and wherein a gate region of the first transistor is electrically coupled to a gate region of the second transistor.

20 Claims, 3 Drawing Sheets

ANALOG CIRCUIT WITH IMPROVED LAYOUT FOR MISMATCH OPTIMIZATION

CROSS REFERENCE TO RELATED APPLICATIONS

The present disclosure claims priority to U.S. Provisional Patent Application No. 61/857,943, filed on Jul. 24, 2013, which is incorporated herein by reference in its entirety.

TECHNICAL FIELD

Embodiments of the present disclosure relate to analog circuits, and in particular to optimizing mismatch between various components of an analog circuit.

BACKGROUND

Two substantially similar semiconductor components (e.g., two transistors) having substantially similar dimensions and configurations can have mismatch (e.g., a small difference in threshold voltages of the two transistors), for example, due to random manufacturing variability. Mismatch between various components in a semiconductor device can deteriorate the performance of the semiconductor device.

FIG. 1A schematically illustrates a conventional current mirror 100 comprising transistors Ta, Tb and Tc. In the current mirror 100, a source of each of the transistors Ta, Tb and Tc is coupled to a supply voltage Vpdd. The gate of the transistors Ta, Tb and Tc are coupled to each other. Furthermore, the gate of the transistor Ta is coupled to a drain of the transistor Ta. A current Ipref output by the transistor Ta is mirrored as currents Ipouta and Ipoutb, respectively, through transistors Tb and Tc. For the currents Ipouta and Ipoutb to substantially mirror the current Iref, each of the transistors Tb and Tc have to be substantially matched to the transistor Ta.

FIG. 1B schematically illustrates a top view of the transistors Ta, Tb and Tc of FIG. 1A; and FIG. 1C schematically illustrates a cross sectional view of the transistors Ta, Tb and Tc. As illustrated in FIGS. 1B and 1C, the transistor Ta has a gate region 14a, a source region 16a1 and a drain region 16a2 formed on an N-well 12a. Also illustrated in FIG. 1C is a pocket implant region 20a (e.g., comprising N-type pocket implant dopants) formed near the source and drain regions of the transistor Ta. The transistors Tb and Tc have similar components as that of the transistor Ta.

The gate regions 14a, 14b and 14c of the transistors Ta, Tb and Tc may have substantially similar dimensions (e.g., to reduce mismatch between the transistors). For example, in FIG. 1B, each of the gate regions 14a, 14b and 14c of the transistors Ta, Tb and Tc have a length L and a width W.

Mismatch between the transistors Ta, Tb and Tc may be reduced, for example, by employing a relatively large width and/or large length of each of the transistors Ta, Tb and Tc. However, it may not always be feasible to employ a relatively large width and/or large length for the transistors Ta, Tb and Tc.

In a semiconductor device (e.g., especially in a semiconductor device in which the well or the substrate gets relatively lightly doped or almost undoped), a mismatch between various components is based on, for example, fluctuations of pocket implant dosage. As an example, a standard deviation of mismatch between threshold voltages of the transistors Ta, Tb and Tc is substantially proportional to an inverse of square root of an average number of dopants in the pocket implant regions of the transistors Ta, Tb and Tc. However, as illustrated in FIG. 1C, each of the transistors Ta, Tb and Tc has relatively few pocket implants. For example, dopants in the pocket implant region 20a of transistor Ta is relatively low, compared to dimensions of the transistor Ta. Such low amount of dopants in the pocket implant regions may result in an increased mismatch between the transistors Ta, Tb and Tc, thereby deteriorating the performance of the current mirror 100.

SUMMARY

In various embodiments, the present disclosure provides a semiconductor device comprising: a substrate; a first transistor formed on the substrate; and a second transistor formed on the substrate, wherein a common region of the semiconductor device forms (i) a drain region of the first transistor, and (ii) a source region of the second transistor, and wherein a gate region of the first transistor is electrically coupled to a gate region of the second transistor. In an embodiment, a pocket implant region is formed on an edge of the common region; and the pocket implant region comprises pocket implant dopants. In an embodiment, a first region forms a source region of the first transistor; and a second region forms a drain region of the second transistor. In an embodiment, the common region is a first common region, and wherein the semiconductor device further comprises: a third transistor formed on the substrate, wherein a second common region of the semiconductor device forms (i) a drain region of the second transistor, and (ii) a source region of the third transistor, and wherein the gate region of the second transistor is electrically coupled to a gate region of the third transistor. In an embodiment, the gate region of the first transistor is electrically coupled to the gate region of the second transistor via a metal layer. In an embodiment, the first transistor and the second transistor are coupled in series. In an embodiment, the gate region of the first transistor has a first dimension and a second dimension; the gate region of the second transistor has a third dimension and a fourth dimension; the first dimension is substantially equal to the third dimension; the second dimension is substantially equal to the fourth dimension; and the first dimension and the third dimension are selected such that a sum of the first dimension and the third dimension is substantially equal to a pre-defined dimension. In an embodiment, the first transistor and the second transistor functionally operate as a single transistor. In an embodiment, each of the first transistor and the second transistor are metal oxide semiconductor field effect transistors (MOSFET).

In various embodiments, the present disclosure provides a method of forming a semiconductor device, the method comprising: forming a substrate; forming a first transistor on the substrate; and forming a second transistor on the substrate, wherein a common region of the semiconductor device forms (i) a drain region of the first transistor, and (ii) a source region of the second transistor, and wherein a gate region of the first transistor is electrically coupled to a gate region of the second transistor. In an embodiment, the method further comprises: forming a pocket implant region on an edge of the common region, wherein the pocket implant region comprises pocket implant dopants. In an embodiment, a first region forms a source region of the first transistor; and a second region forms a drain region of the second transistor. In an embodiment, the common region is a first common region, and wherein the method further comprises: forming a third transistor on the substrate, wherein a second common region of the semiconductor device forms (i) a drain region of the second transistor, and (ii) a source region of the third transistor, and wherein the gate region of the second transistor is electrically coupled to a gate region of the third transistor. In an embodiment, the gate region of the first transistor is electrically coupled to the gate region of the second transistor via a metal layer. In an embodiment, the first transistor and the second transistor are coupled in series. In an embodiment, the gate region of the first transistor has a first dimension and a second dimension; the gate region of the second transistor has a third dimension and a fourth dimension; the first dimension is substantially equal to the third dimension; the second dimension is substantially equal to the fourth dimension; and the method further comprises selecting the first dimension and the third dimension such that a sum of the first dimension and the third dimension is substantially equal to a pre-defined dimension. In an embodiment, the first transistor and the second transistor functionally operate as a single transistor. In an embodiment, each of the first transistor and the second transistor are metal oxide semiconductor field effect transistors (MOSFET).

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

DETAILED DESCRIPTION

Figure 1A:
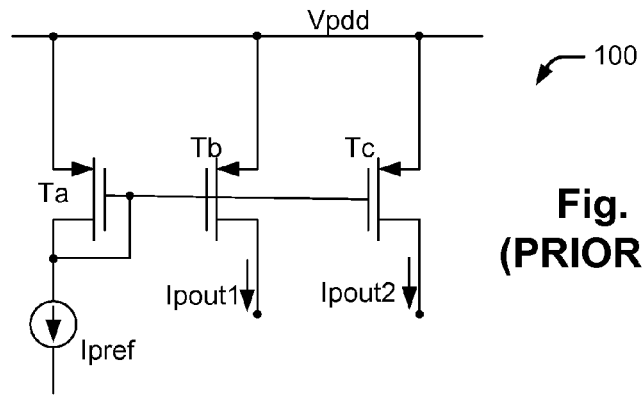
FIG. 1A schematically illustrates a conventional current mirror comprising a plurality of transistors.
Figure 2A:
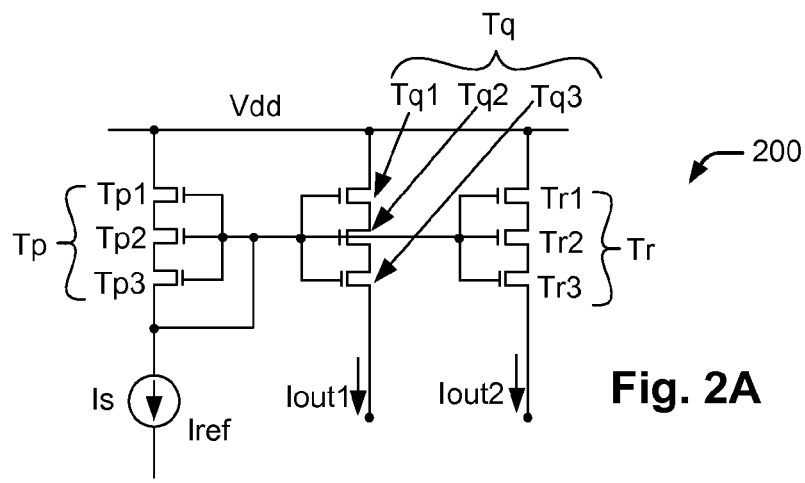
FIG. 2A schematically illustrates a current mirror comprising a plurality of transistors.

FIG. 2A schematically illustrates a current mirror 200 comprising transistors Tp1, Tp2, Tp3, Tq1, Tq2, Tq3, Tr1, Tr2 and Tr3. The current mirror 200 is similar to the current mirror 100 of FIG. 1A. However, in the current mirror 200, the transistors Tp1, Tp2 and Tp3 replace the single transistor Ta of FIG. 1A. Similarly, in the current mirror 200, the transistors Tq1, Tq2 and Tq3 replace the single transistor Tb of FIG. 1A; and the transistors Tr1, Tr2 and Tr3 replace the single transistor Tc of FIG. 1A.

In an embodiment, the transistors Tp1, Tp2 and Tp3 are connected in series (henceforth also referred to as "a series of transistors"), such that a source of the transistor Tp1 is coupled to a voltage source Vdd, a drain of the transistor Tp1 is coupled to a source of the transistor Tp2, a drain of the transistor Tp2 is coupled to a source of the transistor TP3, and a drain of the transistor Tp3 is coupled to a current source Is that supplies a current Iref. A gate of the transistor Tp1 is coupled to the gates of each of the transistors Tp2 and Tp3. Furthermore, the drain of the transistor Tp3 is coupled to the gates of each of the transistors Tp1, Tp2 and Tp3.

The transistors Tq1, Tq2 and Tq3 are also connected in series, such that a source of the transistor Tq1 is coupled to the voltage source Vdd, a drain of the transistor Tq1 is coupled to a source of the transistor Tq2, a drain of the transistor Tq2 is coupled to a source of the transistor Tq3, and a drain of the transistor Tq3 outputs a current Iout1. A gate of the transistor Tq1 is coupled to the gates of each of the transistors Tq2 and Tq3. Furthermore, the gates of the transistors Tq1, Tq2 and Tq3 are coupled to the gates of the transistors Tp1, Tp2 and Tp3, as illustrated in FIG. 2A.

The transistors Tr1, Tr2 and Tr3 are also connected in series in a manner that is similar to the connection of the transistors Tq1, Tq2 and Tq3 illustrated in FIG. 2A.

In an embodiment, the current Iref output by the transistor Tp3 is mirrored as currents Iout1 and Iout2, respectively, by the transistors Tq3 and Tr3, as illustrated in FIG. 2A. For example, each of the currents Iout1 and the current Iout2 is substantially equal to the current Iref.

In an embodiment, the series of transistors Tp1, Tp2 and Tp3 is functionally equivalent to a single transistor Tp. For example, from a functional point of view, the transistors Tp1, Tp2 and Tp3 can be replaced by the single transistor Tp.

Similarly, from functional point of view, the transistors Tq1, Tq2 and Tq3 can be replaced by a corresponding single transistor Tq; and the transistors Tr1, Tr2 and Tr3 can be replaced by a corresponding single transistor Tr.

Figure 2B:
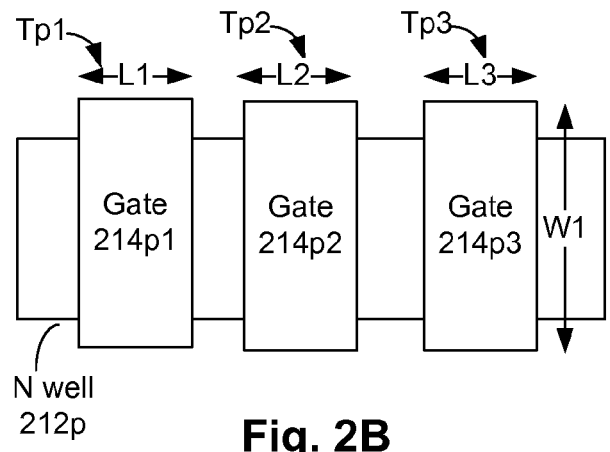
FIG. 2B schematically illustrates a top view of a subset of the plurality of transistors of FIG. 2A.
Figure 2C:
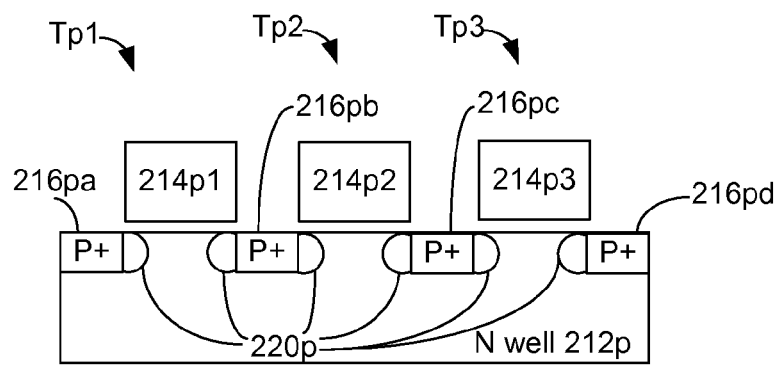
FIG. 2C schematically illustrates a cross sectional view of the subset of the plurality of transistors of FIG. 2A.

FIG. 2B schematically illustrates a top view of the transistors Tp1, Tp2 and Tp3 of the current mirror 200 of FIG. 2A; and FIG. 2C schematically illustrates a cross sectional view of the transistors Tp1, Tp2 and Tp3 of the current mirror 200 of FIG. 2A. Although the transistors illustrated in FIGS. 2A-2C are P channel metal oxide semiconductor field effect (PMOS) transistors, the transistors can be of any other appropriate type (e.g., NMOS transistors). Although FIG. 2A illustrates the current Iref being mirrored as two currents Iout1 and Iout2 (i.e., the current mirror 200 including three series of transistors), in another embodiment, the current Iref may be mirrored as any different number of currents (i.e., the current mirror 200 may comprise any different number of mirrored paths, and any corresponding different number of series of transistors). Although FIGS. 2A-2C illustrate three corresponding transistors being coupled in a series of transistors (e.g., transistors Tp1, Tp2 and Tp3 being coupled in series), any different number of transistors (e.g., two, four, etc.) may also be coupled in a corresponding series of transistors.

As illustrated in FIGS. 2B and 2C, the transistors Tp1, Tp2 and Tp3 are formed on an N type substrate (e.g., N well 212p). The transistor Tp1 has a corresponding gate region 214p1. A region 216pa, which is formed on the N-well 212p and is doped with P type dopants, forms a source region of the transistor Tp1. A region 216pb, which is formed on the N-well 212p and is doped with P type dopants, forms a drain region of the transistor Tp1.

The transistor Tp2 has a corresponding gate region 214p2. Furthermore, the region 216pb also forms a source region for the transistor Tp2. Thus, the region 216pb is a common region for both the transistors Tp1 and Tp2. A region 216pc, which is formed on the N-well 212p and is doped with P type dopants, forms a drain region of the transistor Tp2.

The transistor Tp3 has a corresponding gate region 214p3. Furthermore, the region 216pc also forms a source region for the transistor Tp3. Thus, the region 216pc is a common region for both the transistors Tp2 and Tp3. A region 216pd, which is formed on the N-well 212p and is doped with P type dopants, forms a drain region of the transistor Tp3.

In an embodiment and although not illustrated in FIGS. 2B and 2C, the gate regions 214p1, 214p2 and 241p3 of the transistors Tp1, Tp2 and Tp3 are coupled to each other. For example, the gate regions 214p1, 214p2 and 241p3 are coupled via one or more metal layers, conductive traces, and/or the like.

Also illustrated in FIG. 2C are pocket implant regions 220p formed near or on the edges of the regions 216pa, 216pb, 216pc and 216pd. In an embodiment, the pocket implant regions 220p comprise N-type pocket implants or N type dopants.

In an embodiment, each of the gate regions 214p1, 214p2 and 214p3 has a width of W1, and the gate regions 214p1, 214p2 and 214p3 have lengths L1, L2 and L3, respectively. In an embodiment, the lengths L1, L2 and L3 are substantially similar.

Although not illustrated in FIGS. 2B-2C, the series of transistors Tq1, Tq2, Tq3 is structurally similar to the series of transistors Tp1, Tp2, Tp3; and the series of transistors Tr1, Tr2, Tr3 is structurally similar to the series of transistors Tp1, Tp2, Tp3. For example, the transistors Tq1, Tq2, Tq3 have structures that are substantially similar to the structures of the transistors Tp1, Tp2, Tp3, respectively, as illustrated in FIGS. 2B and 2C. Accordingly, the structures of the series of transistors Tp1, Tp2, Tp3, and the series of transistors Tr1, Tr2, Tr3 are not illustrated separately in the figures.

As previously discussed, the series of transistors Tp1, Tp2 and Tp3 is functionally equivalent to a single transistor Tp. For example, from a functional point of view, the transistors Tp1, Tp2 and Tp3 can be replaced by the single transistor Tp. In an example, a sum of the lengths L1, L2 and L3 of the transistors Tp1, Tp2 and Tp3 (i.e., an effective length of a gate of the functionally equivalent transistor Tp) is substantially equal to a predefined length. For example, if the transistors Tp1, Tp2 and Tp3 of the current mirror 200 of FIG. 2A are to replace the single transistor Ta of the current mirror 100 of FIG. 1A, then sum of the lengths L1, L2 and L3 of the transistors Tp1, Tp2 and Tp3, for example, is substantially equal to the length L of the transistor Ta.

Figure 1B:
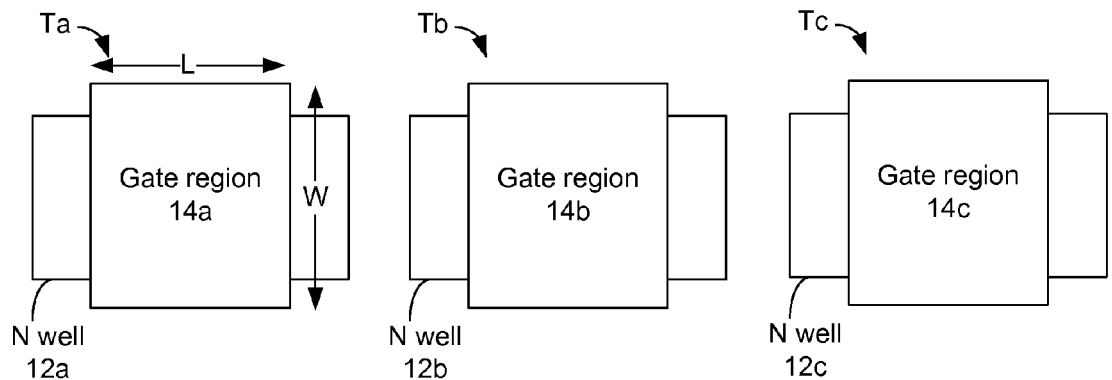
FIG. 1B schematically illustrates a top view of the plurality of transistors of FIG. 1A.
Figure 1C:
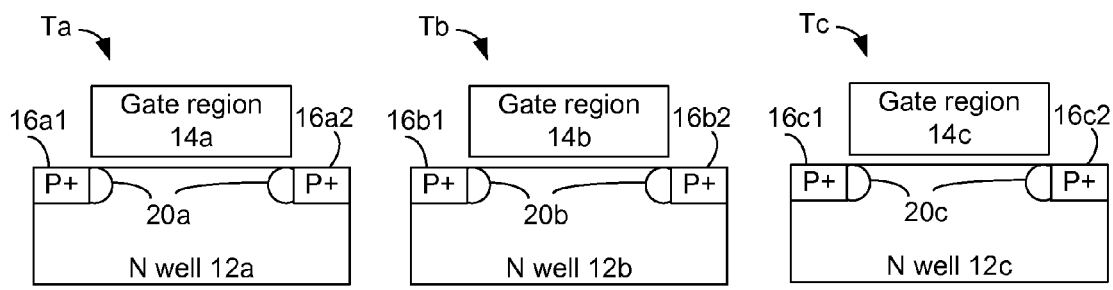
FIG. 1C schematically illustrates a cross sectional view of the plurality of transistors of FIG. 1A.

Replacing the transistor Ta in the current mirror 100 of FIGS. 1A-1C with the three transistors Tp1, Tp2 and Tp3 in the current mirror 200 of FIGS. 2A-2C has several advantages. For example, (i) the gate length of the transistor Ta and (ii) the effective gate length of the transistors Tp1, Tp2 and Tp3 are substantially similar. However, the transistor Ta has pocket implant regions 20a formed near the regions 16a1 and 16a2. In contrast, in the transistors Tp1, Tp2 and Tp3, pocket implant regions 220p are formed near regions 216pa, 216pb, 216pc and 216pd. Thus, a number of dopants in the pocket implant regions 220p of the series of transistors Tp1, Tp2, Tp3 is relatively higher than a number of dopants in the pocket implant regions 20p of the transistor Ta. Thus, although the transistor Ta is functionally similar to the series of transistors Tp1, Tp2, Tp3, the series of transistors Tp1, Tp2, Tp3 has a higher number of dopants in the pocket implant regions 220p compared to that in the transistor Ta. Similarly, although the transistor Tb is functionally similar to the series of transistors Tq1, Tq2, Tq3, the series of transistors Tq1, Tq2, Tq3 has a higher number of dopants in corresponding pocket implant regions compared to that in the transistor Tb. Similarly, although the transistor Tc is functionally similar to the series of transistors Tr1, Tr2, Tr3, the series of transistors Tr1, Tr2, Tr3 has a higher number of dopants in corresponding pocket implant regions compared to that in the transistor Tc.

Increasing a number of dopants in pocket implant regions of two transistors results in a decrease in a standard deviation of a mismatch between threshold voltages of the two transistors. Thus, as the number of dopants in the pocket implant regions of each of the series of transistors Tp1, Tp2, Tp3, the series of transistors Tq1, Tq2, Tq3, and the series of transistors Tr1, Tr2, Tr3 are relatively high (e.g., higher than the number of dopants in the pocket implant regions of each of the transistors Ta, Tb, Tc), a standard deviation of mismatch between threshold voltages of the equivalent transistors Tp, Tq and Tr is relatively low, thereby resulting in better matching of the currents Iref, Iout1 and Iout 2.

For example, assume that the transistor Ta has N number of dopants in the pocket implant regions 20a. Accordingly, a standard deviation of mismatch between threshold voltages of the transistors Ta, Tb, Tc is substantially proportional to $1/\sqrt{N}$, where $\sqrt{N}$ represents a square root of N. In the series of transistors Tp1, Tp2, Tp3, the number of dopants in the pocket implant regions 220p is almost three times N, i.e., 3N (e.g., as the pocket implant regions 220p is about thrice the size of the pocket implant regions 20a). Accordingly, a standard deviation of mismatch between the threshold voltages of the functionally equivalent transistors Tp, Tq, Tr is substantially proportional to $1/\sqrt{3N}$, where $\sqrt{3N}$ represents a square root of 3N. Thus, the standard deviation of mismatch between threshold voltages associated with the series of transistors Tp1, Tp2, Tp3 is much lower than that of the transistor Ta.

Thus, replacing a single transistor (e.g., transistor Ta of FIGS. 1A-1C) with a functional equivalent series of transistors Tp1, Tp2 and Tp3 results in an improvement in the mismatch, without substantially increasing effective dimensions of the gate region (i.e., as discussed, dimensions of the gate region 14a of the transistor Ta is substantially equal to effective dimensions of the gate regions 214p1, 214p2, 214p3 of the transistors Tp1, Tp2, Tp3).

In an embodiment, having a series of transistors Tp1, Tp2 and Tp3 in the current mirror 200 of FIGS. 2A-2C (e.g., instead of a single transistor) also ensures, for example, that a line edge roughness (LER) effect along a gate length in the series of transistors direction is averaged out due to multiple stacked transistors, thereby making a critical dimension of the gate region of the transistors a relatively smaller factor in device mismatch.

As previously discussed, in an embodiment, the lengths L1, L2 and L3 of the gate regions 214p1, 214p2 and 214p3 are substantially equal (e.g., say equal to a length Lp). In an embodiment, the length Lp is equal or near equal to a minimum length of a gate region, as allowed for a given technology used to fabricate the transistors of the current mirror 200. This allows usage of a maximum number of transistors in a series of transistors.

For example, assume that the gate length L of the transistor Ta is 100 units. The transistor Ta can be replaced by a series of transistors, where the series of transistors comprises two, three, four, or more number of transistors (e.g., the series of transistors in the example of FIGS. 2A-2C comprises three transistors tp1, tp2, tp3). A first option would be to replace the transistor Ta with two transistors, each having a gate length of 50 units; a second option would be to replace the transistor Ta with three transistors, each having a gate length of 33.33 units; a third option would be to replace the transistor Ta with four transistors, each having a gate length of 25 units; and so on. Also assume that the technology used for fabricating the transistors allows a minimum gate length of 30 units. As the minimum gate length has to be 30 units, the third option of replacing the transistor Ta with four transistors cannot be implemented. In such a case, the second option is to be chosen, in which the transistor Ta is replaced with three transistors, each having a gate length of 33.33 units. Choosing the second option, instead of the first option, allows a maximum number of transistors (i.e., three) used for replacing the transistor Ta (e.g., instead of using two transistors to replace the transistor Ta), thereby increasing an amount of dopant in the pocket implant regions, and thus decreasing possibilities of mismatch.

In an embodiment, a distance between gates of two adjacent transistors in a series of transistors (e.g., distance between gate regions 214p1 and 214p2 in FIGS. 2B and 2C) is made as small as possible, as allowed under the technology used to fabricate the transistors. Having smaller distance between gates of two adjacent transistors in a series of transistors, for example, minimizes parasitic resistances and improves layout of the transistors (e.g., by reducing an area occupied by the series of transistors).

Although FIG. 2A illustrates using the various series of transistors in a current mirror, the various series of transistors (e.g., the series of transistors Tp1, Tp2, Tp3, the series of transistors Tq1, Tq2, Tq3, and/or series of transistors Tr1, Tr2, Tr3) can be used in any other appropriate circuit as well.

Figure 3:
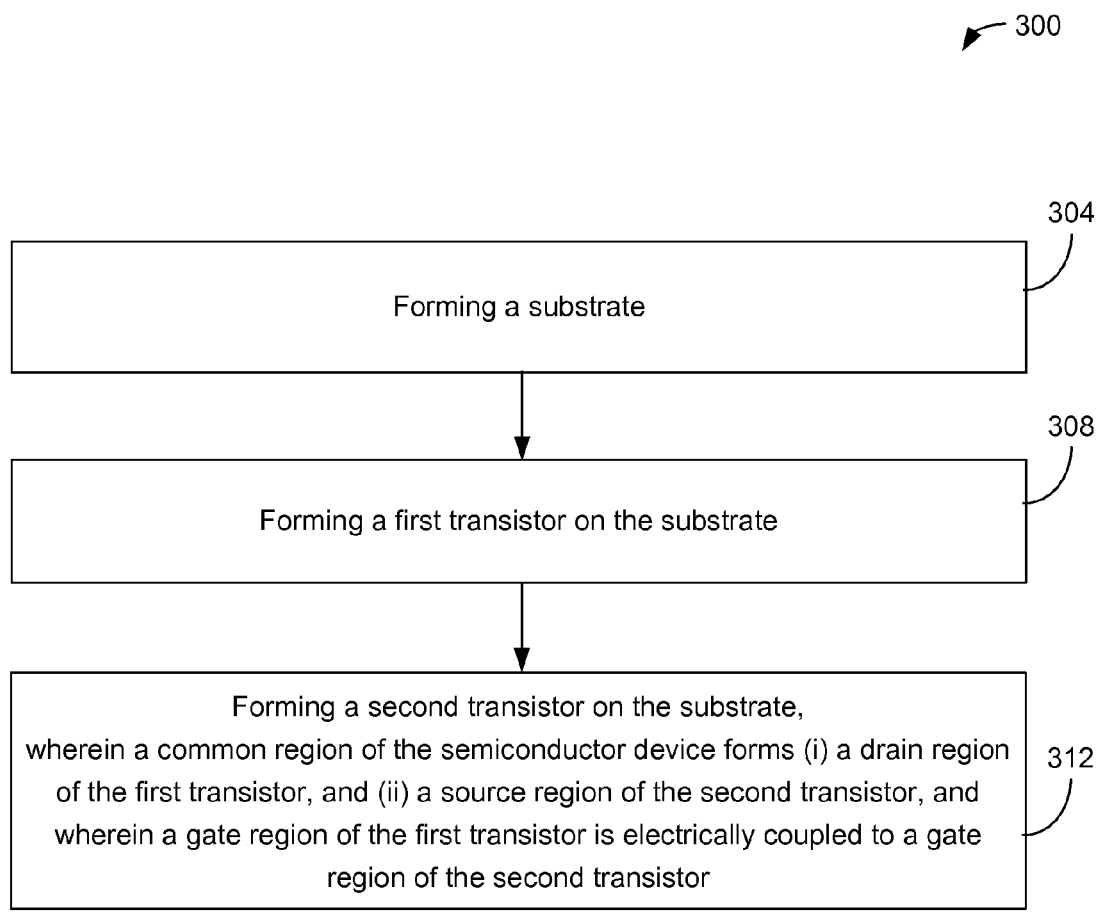
FIG. 3 is a flow diagram of a method for forming a semiconductor device.

FIG. 3 is a flow diagram of a method 300 for forming a semiconductor device (e.g., the series of transistors Tp1, Tp2, Tp3). At 304, a substrate (e.g, the N well 212p of FIGS. 2B and 2C) is formed. At 308, a first transistor (e.g., the transistor Tp1 of FIGS. 2A-2C) is formed on the substrate. At 312, a second transistor (e.g., the transistor Tp2 of FIGS. 2A-2C) is formed on the substrate. In an embodiment, a common region (e.g., the region 216pb of FIG. 2C) of the semiconductor device forms (i) a drain region of the first transistor, and (ii) a source region of the second transistor. In an embodiment, a gate region (e.g., the gate region 214p1) of the first transistor is electrically coupled to a gate region (e.g., the gate region 214p2) of the second transistor.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A semiconductor device comprising:
    a substrate;
    a first transistor formed on the substrate;
    a second transistor formed on the substrate; and
    a third transistor formed on the substrate,
    wherein a first common region of the semiconductor device forms (i) a drain region of the first transistor, and (ii) a source region of the second transistor,
    wherein a second common region of the semiconductor device forms (i) a drain region of the second transistor, and (ii) a source region of the third transistor,
    wherein a gate region of the first transistor is electrically coupled to a gate region of the second transistor, and
    wherein the gate region of the second transistor is electrically coupled to a gate region of the third transistor.

2. The semiconductor device of claim 1, wherein:
    a pocket implant region is formed on an edge of the common region; and
    the pocket implant region comprises pocket implant dopants.

3. The semiconductor device of claim 1, wherein:
    a first region forms a source region of the first transistor; and
    a second region forms a drain region of the second transistor.

4. The semiconductor device of claim 3, wherein:
    a first pocket implant region is formed on an edge of the first region;
    a second pocket implant region is formed on an edge of the common region; and
    a third pocket implant region is formed on an edge of the second region.

5. The semiconductor device of claim 1, wherein the gate region of the first transistor is electrically coupled to the gate region of the second transistor via a metal layer.

6. The semiconductor device of claim 1, wherein the first transistor and the second transistor are coupled in series.

7. The semiconductor device of claim 1, wherein:
    the gate region of the first transistor has a first dimension and a second dimension;
    the gate region of the second transistor has a third dimension and a fourth dimension;
    the first dimension is substantially equal to the third dimension;
    the second dimension is substantially equal to the fourth dimension; and
    the first dimension and the third dimension are selected such that a sum of the first dimension and the third dimension is substantially equal to a pre-defined dimension.

8. The semiconductor device of claim 1, wherein (i) the first transistor, (ii) the second transistor, and (iii) the third transistor functionally operate as a single transistor.

9. The semiconductor device of claim 1, wherein each of the first transistor and the second transistor are metal oxide semiconductor field effect transistors (MOSFET).

10. The semiconductor device of claim 1, wherein the gate region of the second transistor is electrically coupled to the gate region of the third transistor via a metal layer.

11. A method of forming a semiconductor device, the method comprising:
    forming a substrate;
    forming a first transistor on the substrate;
    forming a second transistor on the substrate; and
    forming a third transistor on the substrate,
    wherein a first common region of the semiconductor device forms (i) a drain region of the first transistor, and (ii) a source region of the second transistor,
    wherein a second common region of the semiconductor device forms (i) a drain region of the second transistor, and (ii) a source region of the third transistor,
    wherein a gate region of the first transistor is electrically coupled to a gate region of the second transistor, and
    wherein the gate region of the second transistor is electrically coupled to a gate region of the third transistor.

12. The method of claim 11, further comprising:
    forming a pocket implant region on an edge of the common region,
    wherein the pocket implant region comprises pocket implant dopants.

13. The method of claim 11, wherein:
a first region forms a source region of the first transistor; and
a second region forms a drain region of the second transistor.

14. The method of claim 13, further comprising:
forming a first pocket implant region on an edge of the first region;
forming a second pocket implant region on an edge of the common region; and
forming a third pocket implant region on an edge of the second region.

15. The method of claim 11, wherein the gate region of the first transistor is electrically coupled to the gate region of the second transistor via a metal layer.

16. The method of claim 11, wherein the first transistor and the second transistor are coupled in series.

17. The method of claim 11, wherein:
the gate region of the first transistor has a first dimension and a second dimension;
the gate region of the second transistor has a third dimension and a fourth dimension;
the first dimension is substantially equal to the third dimension;
the second dimension is substantially equal to the fourth dimension; and
the method further comprises
selecting the first dimension and the third dimension such that a sum of the first dimension and the third dimension is substantially equal to a pre-defined dimension.

18. The method of claim 11, wherein the first transistor, the second transistor and the third transistor functionally operate as a single transistor.

19. The method of claim 11, wherein each of the first transistor and the second transistor are metal oxide semiconductor field effect transistors (MOSFET).

20. The method of claim 11, wherein the gate region of the second transistor is electrically coupled to the gate region of the third transistor via a metal layer.

* * * * *